(12) United States Patent
Ramalho et al.

(10) Patent No.: US 6,324,028 B1
(45) Date of Patent: Nov. 27, 2001

(54) RECORDING APPARATUS PROVIDED WITH A WRITE DRIVER CIRCUIT

(75) Inventors: Joao N. V. L. Ramalho, Bieville-Beuville (FR); Johannes O. Voorman; Gerben W. De Jong, both of Eindhoven (NL); Luan Le; Eric Pieraerts, both of Caen (FR)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/313,038

(22) Filed: May 17, 1999

(30) Foreign Application Priority Data

May 19, 1998 (EP) .................................................. 98401208

(51) Int. Cl.[7] ................................ G11B 5/02; G11B 5/09
(52) U.S. Cl. ............................................... 360/68; 360/46
(58) Field of Search ........................................ 360/46, 68

(56) References Cited

U.S. PATENT DOCUMENTS

| | | | |
|---|---|---|---|
| 4,853,800 | 8/1989 | Schulz | 360/46 |
| 5,357,379 * | 10/1994 | Gower | 360/46 |
| 5,986,832 * | 11/1999 | Barnett | 360/46 |
| 6,008,719 * | 12/1999 | Jolivet | 338/309 |

FOREIGN PATENT DOCUMENTS

2735498A1   2/1979   (DE) .

OTHER PUBLICATIONS

"150 Mb/s Write Amplifier for Hard Disk Drives with Near Rail-to-Rail Voltage Swing", H. Veenstra et al., 1995.
"A Resonant Switching Write Driver for Magnetic Recording", Richard Reay et al., IEEE Journal of Solid-State Circuits, vol. 32, No. 2, Feb. 1997.

* cited by examiner

*Primary Examiner*—Regina Y. Neal
(74) *Attorney, Agent, or Firm*—Bernard Franzblau

(57) ABSTRACT

A recording apparatus for recording an information signal on a magnetic record carrier includes a write driver circuit and a magnetic write head. The write driver circuit comprises a first voltage driver and a second voltage driver. A first current driver and a second current driver are present for driving the write head. The first and second voltage driver each include a respective series circuit of an npn transistor and a bidirectional impedance element coupled between a point of constant potential and the respective outputs of the first and second voltage drivers.

20 Claims, 2 Drawing Sheets

RECORDING APPARATUS PROVIDED WITH A WRITE DRIVER CIRCUIT

BACKGROUND OF THE INVENTION

This invention relates to a recording apparatus for recording an information signal on a magnetic record carrier, the apparatus comprising:

an input terminal for receiving the information signal, a write driver circuit and a magnetic write head, the write driver circuit comprising a first voltage driver having an input coupled to the input terminal of the apparatus, and an output coupled to a first terminal of the magnetic write head, a second voltage driver having an input coupled to the input terminal of the apparatus and an output coupled to the second terminal of the write head, as well as to a write driver circuit for use in the recording apparatus.

Write drivers of the voltage drive type are well known in the art. Reference is made in this respect to U.S. Pat. No. 4,853,800 (D1 in the list of related documents that can be found at the end of this description) and DE-A 2,735,498 (D2).

There is a strong pressure, especially on hard-disk drive manufacturers, to increase bit density and to shorten access times. The current rate of increase in bit density (60 % per annum) is being sustained by a variety of technical improvements with a resulting increase in data rates of 40 % per year. In order to sustain this increase in data rates, the high frequency performance of the media, heads and electronics, in particular the write driver, have to increase at the same rate.

Conventional write driver techniques, based on current driving, see D3, current steering, see D4, have severe speed limitations. These limitations result not only from poor high-frequency performance inside the driver, but also from limitations imposed by the head-amplifier combination. In addition to the poor high-frequency performance of thin-film write heads, these shortcomings have become a major limitation in the write process for magnetic recording.

SUMMARY OF THE INVENTION

It is an object of the invention to further improve the recording characteristics of the recording apparatus. The recording apparatus in accordance with the invention is characterized in that the first voltage driver circuit comprises an output circuit of a series arrangement of an npn transistor and an impedance, coupled between a point of a first constant potential and the output of the first voltage driver circuit, that the second voltage driver circuit comprises an output circuit of a series arrangement of an npn transistor and an impedance, coupled between said point of a first constant potential and the output of the second voltage driver circuit, the apparatus further comprising a first current driver having an input coupled to the input terminal and an output coupled to said first terminal of the write head, and a second current driver having an input coupled to the input terminal and an output coupled to said second terminal of the write head. The invention is based on the recognition to combine voltage drive and current drive techniques in order to obtain an improved recording apparatus.

A voltage driver is proposed for the reason that it does not only has a superior internal high-frequency performance, but is also less sensitive to the performance limitations resulting from head-amplifier combinations. Further, by adding a current driver, preferably comprising at least one transistor of the npn type, coupled between its output and the point of a second constant potential, which is the negative supply voltage, an improved behavior can be obtained. Both the current driver as well as the voltage driver have been realized by npn transistors. npn transistors are much faster in their characteristics, so that replacing the pnp transistor normally present in a current driver circuit by a voltage driver having an npn transistor in its output circuit speeds up the circuit significantly.

The write driver proposed herein has a major advantage in that it can be integrated in a chip area much smaller than that used for previous current drivers. The reduced chip area comes as a result of an improved architecture.

BRIEF DESCRIPTION OF THE DRAWINGS

These and other aspects of the invention will become more apparent in the following figure description, in which.

DESCRIPTION OF THE PREFERRED EMBODIMENTS

Figure 1:
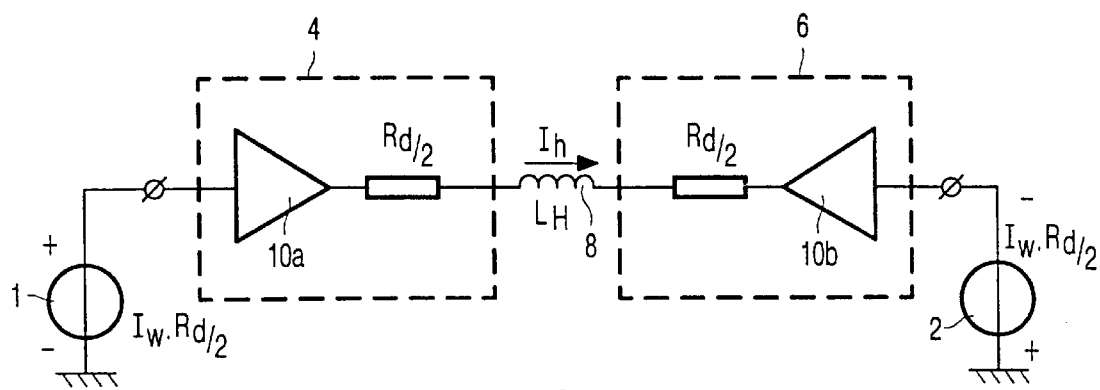
FIG. 1 shows a principle diagram of a write driver circuit, provided with voltage drivers, in which the voltage drivers are driven by a differential voltage source.

The write driver circuit shown in FIG. 1 receives an input signal from a differential voltage source, indicated in FIG. 1 by the two voltage sources 1 and 2 that generate a voltage $I_w \cdot R_d/2$, with the polarities as shown in FIG. 1. The write driver circuit comprises a first voltage driver 4 and second voltage driver 6. FIG. 1 further shows the write head 8 driven by the write driver circuit. The voltage drivers each comprise a voltage follower 10a, 10b and a series resistor $R_d/2$.

Figure 2:
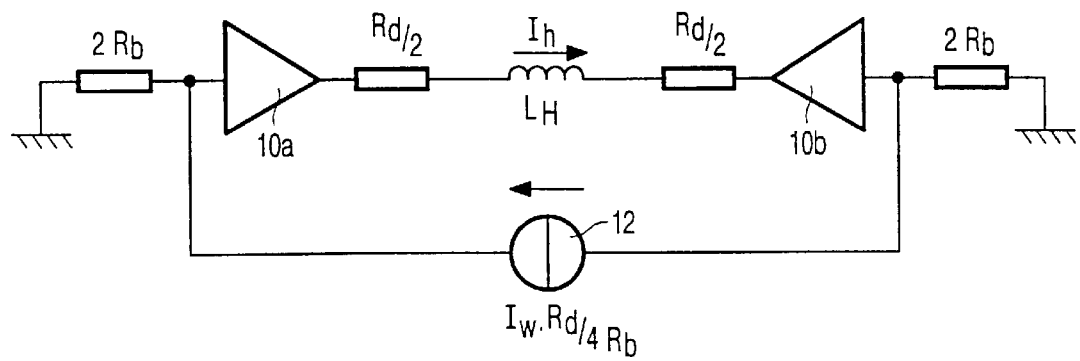
FIG. 2 shows the principle diagram of FIG. 1, in which the voltage drivers are driven by a voltage source implemented with a current source.
Figure 3:
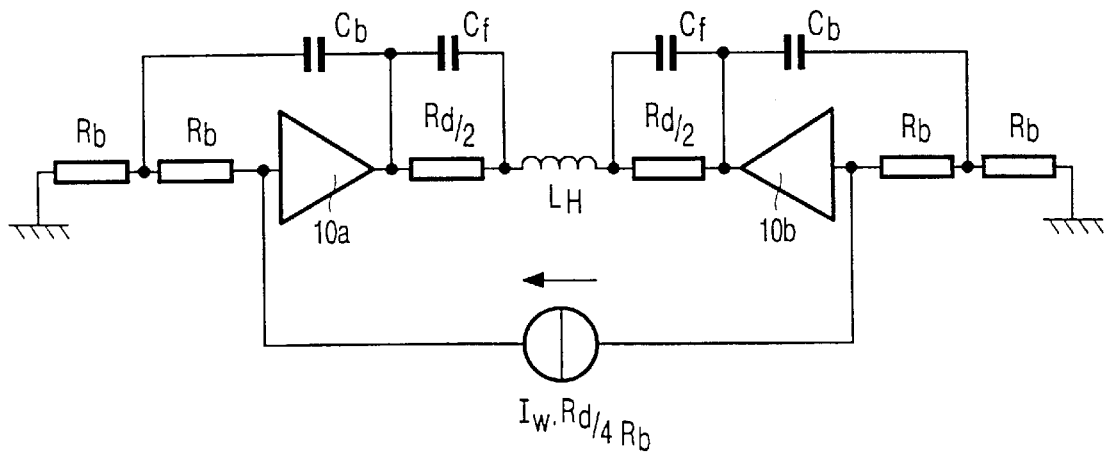
FIG. 3 shows an elaborated version of the driver circuit of FIG. 2.

FIG. 2 shows how the voltage sources 1 and 2 can be implemented with a current source 12 and the resistors $2R_b$. The bandwidth of the write driver circuit can be increased by adding capacitors $C_b$ across the voltage followers 10a and 10b and a corresponding resistor $R_b$, as shown in FIG. 3. This results in an improvement of the step response of the write driver circuit. The addition of the capacitors $C_f$ across the resistors $R_d/2$ in the output chain of the voltage drivers improves the behavior as well, in that it speeds up the response of the driver circuit.

The voltage followers 10a and 10b can be realized in various ways, such as in the form of a class A voltage follower, or a class A/B voltage follower.

Figure 4:
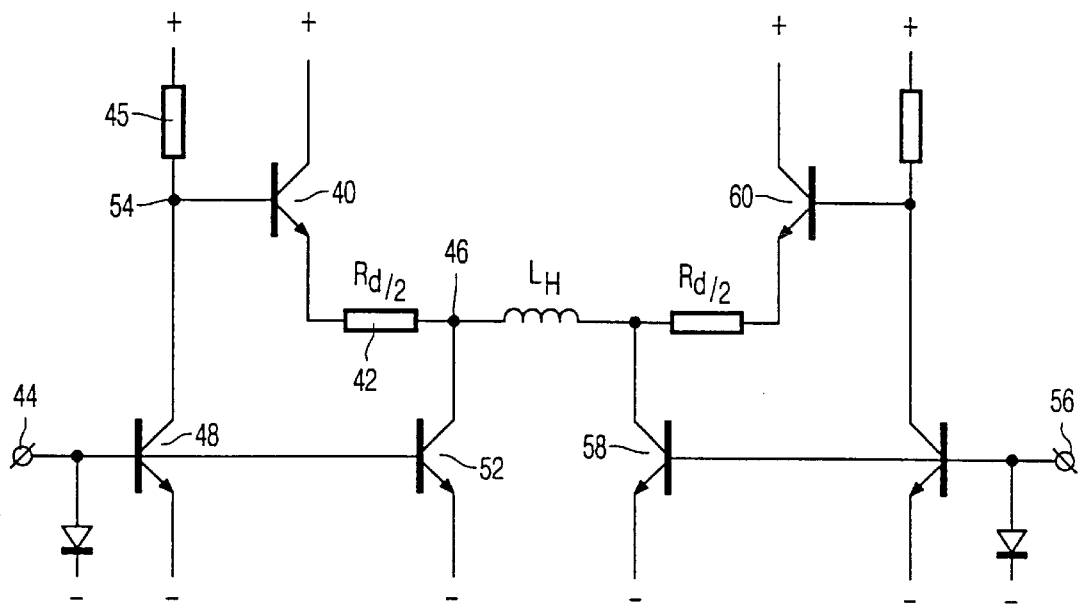
FIG. 4 shows the essential elements of the driver circuit in accordance with the invention, and FIG. 5 a further elaborated version of the driver circuit of FIG. 4.

FIG. 4 shows the essential elements of the write driver circuit in accordance with the invention. The first voltage driver comprises an npn transistor 40 and the impedance 42 in a series connection between the positive supply voltage (+) and the output 46. A series connection of an impedance 45 and a current source 48 is provided between the positive (+) and negative (−) supply voltages. The current source 48 is in the form of an npn transistor as well. The current driver comprises an npn transistor 52 coupled between the output 46 and the negative supply voltage (−). The current driver 52 could be considered to be coupled in parallel with the current source 48. An equivalent circuit construction is shown for the right hand side of the write driver circuit.

An input signal supplied to the input terminal 44, which is in the form of a current having either a "high" current or a "low" current, such as a zero current, controls the voltage driver and the current driver in the following way. In response to a high current supplied to the input 44, a current flows through the current source 48, so that the voltage at the node 54 is "low". As a result, the voltage at the output 46 is low and the current driver 52 receives a current that flows through the head $L_H$. In response to a "low" current supplied to the input 44, no current flows through the current source 48, so that the voltage at the node 54 is "high", and thus the voltage at the output 46 is high, resulting in a current running via the output 46 through the head $L_H$.

Further, when the input 44 receives a "high" current, the input 56 receives a "low" (no) current. As a result, the current that flows through the head $L_H$ runs from the positive supply voltage (+), via the transistor 40, through the head $L_H$ and via the transistor 58 to the negative supply voltage. And, when the input 44 receives a "low" current, the input 56 receives a "high" current. As a result, the current that flows through the head $L_H$ runs from the positive supply voltage (+), via the transistor 60, through the head $L_H$ and via the transistor 52 to the negative supply voltage.

Figure 5:
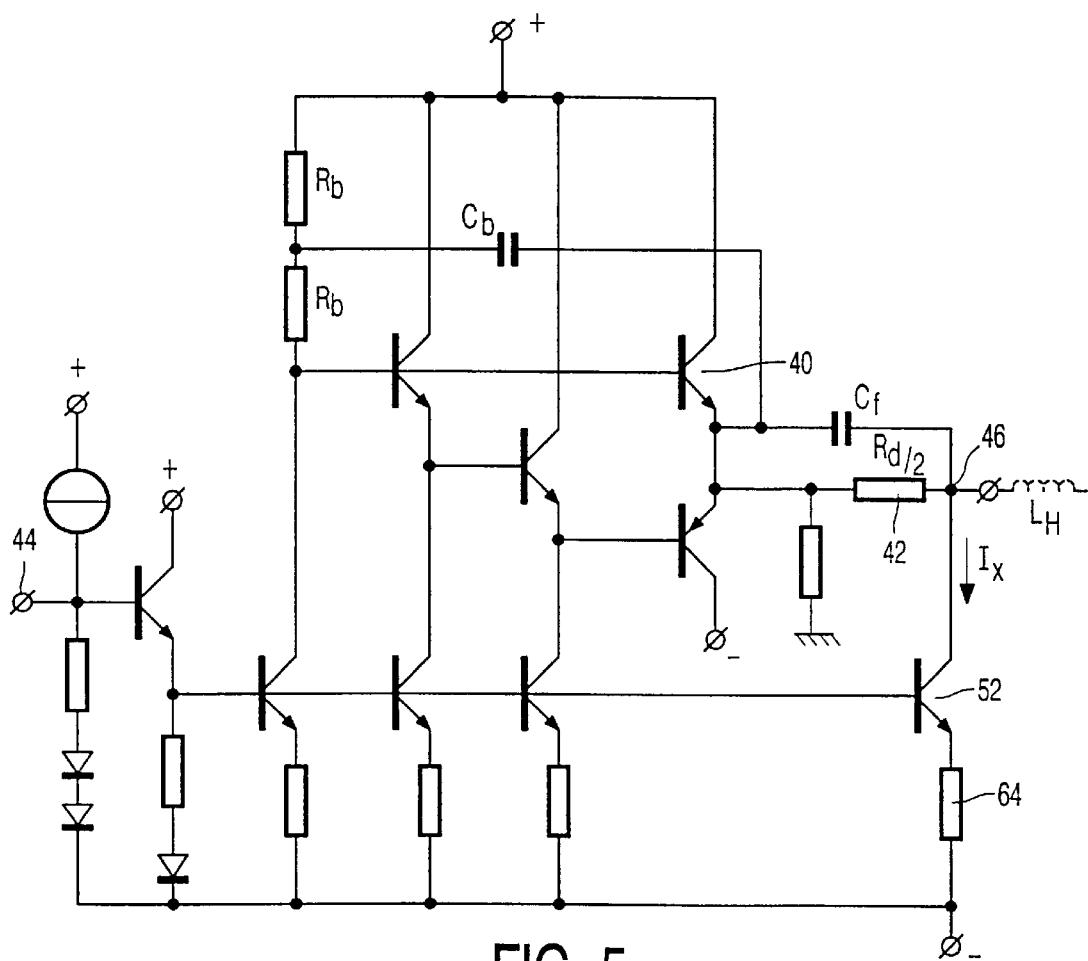

FIG. 5 shows a further elaborated version of the only the left hand side of the write driver circuit of FIG. 4. From FIG. 5, it is clear that npn transistors are used in the output circuits of both the voltage driver and the current driver. This has the advantage over using pnp transistors in that npn transistors can cope with larger currents and are faster than pnp transistors. When using npn transistors, this implies a smaller chip surface area that is required for realizing the writer circuit. Further, the voltage drop across $R_d/2$ is reduced, for the reason that current through the head $L_H$ is now (partly) taken up by the current source 52.

Whilst the invention has been described with reference to preferred embodiments thereof, it is to be understood that these are not limitative examples. Thus, various modifications may become apparent to those skilled in the art, without departing from the scope of the invention, as defined by the claims.

Further, the invention lies in each and every novel feature or combination of features.

RELATED DOCUMENTS

| | |
|---|---|
| D1 | U.S. Pat. No. 4,853,800 |
| D2 | DE-A 2,735,498 |
| D3 | H. Veenstra et al, "150 Mb/s write amplifier for hard-disk drives near rail-to-rail voltage swing", Proc. of the ESCIRC, 1995. |
| D4 | R. J. Reay et al, "A resonant switching write driver for magnetic recording", IEEE Jrnl of Solid-State Circuits, Vol. 32, no. 2, pp. 267–69, Febr. 1997. |

We claim:

1. A recording apparatus for recording an information signal on a magnetic record carrier, the apparatus comprising:

an input terminal for receiving the information signal, a magnetic write head, and a write driver circuit comprising;

a first voltage driver having an input coupled to the input terminal of the apparatus, and an output coupled to a first terminal of the magnetic write head, a second voltage driver having an input coupled to the input terminal of the apparatus and an output coupled to the second terminal of the write head, characterized in that the first voltage driver circuit comprises an output circuit of a series arrangement of an npn transistor and a bidirectional impedance, coupled between a point of a first constant potential and the output of the first voltage driver circuit, and the second voltage driver circuit comprises an output circuit of a series arrangement of an npn transistor and a bidirectional impedance, coupled between said point of first constant potential and the output of the second voltage driver circuit, the apparatus further comprising;

a first current driver having an input coupled to the input terminal and an output coupled to said first terminal of the write head, and a second current driver having an input coupled to the input terminal and an output coupled to said second terminal of the write head.

2. The recording apparatus as claimed in claim 1, wherein the first and second current drivers each comprise a transistor of the npn type, coupled between their output and a point of a second constant potential.

3. The recording apparatus as claimed in claim 2, wherein said second constant potential is the negative supply voltage of the write driver circuit.

4. The recording apparatus as claimed in claim 1, wherein said first constant potential is the positive supply voltage of the write driver circuit.

5. The recording apparatus as claimed in claim 4, wherein the first and second current drivers are devoid of a transistor of the pnp type between their output and a second point of a second constant potential, said second constant potential having a polarity opposite to the polarity of the first constant potential.

6. The recording apparatus as claimed in claim 1, wherein said first voltage driver is adapted to generate a first voltage signal at its output in response to the information signal having a first amplitude, the second current driver being adapted to generate a first current signal in response to said information signal having said first amplitude, said second voltage driver is adapted to generate a second voltage signal at its output in response to the information signal having a second amplitude, the first current driver being adapted to generate a second current signal in response to said information signal having said second amplitude.

7. The recording apparatus as claimed in claim 1, wherein the magnetic write head is of the thin film inductive type.

8. Recording apparatus as claimed in claim 1, wherein the first voltage driver comprises a series arrangement of an impedance and a switchable current source coupled between said point of first constant potential and a point of second constant potential, a node in the series connection between said impedance and said switchable current source being coupled to a control electrode of the npn transistor in the first voltage driver.

9. Recording apparatus as claimed in claim 8, characterized in that the first current driver comprises a current source which is coupled in parallel with the current source of the first voltage driver.

10. The recording apparatus as claimed in claim 9, wherein the current source of the first voltage driver comprises an npn transistor and the current source of the first current driver comprises an npn transistor, control electrodes of both npn transistors being interconnected.

11. The recording apparatus as claimed in claim 8, characterized in that the second voltage driver comprises a series arrangement of a second impedance and a second switchable current source coupled between said point of first constant potential and a point of second constant potential, a node in the series connection between said second impedance and said second switchable current source being coupled to a control electrode of the npn transistor in the second voltage driver.

12. The recording apparatus as claimed in claim 11, wherein the second current driver comprises a current source which is coupled in parallel with the current source of the second voltage driver.

13. The recording apparatus as claimed in claim 12, wherein the current source of the second voltage driver comprises an npn transistor and the current source of the second current driver comprises an npn transistor, control electrodes of both npn transistors being interconnected.

14. A write amplifier for use in a magnetic recording apparatus, comprising:
   first and second input terminals for receipt of an information signal,
   first and second output terminals for connection to a magnetic write head,
   a write driver circuit comprising;
   a first voltage driver having an input terminal coupled to the first input terminal and an output coupled to the first output terminal, wherein the first voltage driver comprises a series circuit of an npn transistor and a first bidirectional impedance element coupled between a point of first constant voltage and the first output terminal,
   a second voltage driver having an input terminal coupled to the second input terminal and an output coupled to the second output terminal, wherein the second voltage driver comprises a series circuit of an npn transistor and a second bidirectional impedance element coupled between the point of first constant voltage and the second output terminal,
   a first current driver having an input coupled to the first input terminal and an output coupled to the first output terminal, and
   a second current driver having an input coupled to the second input terminal and an output coupled to the second output terminal.

15. The write amplifier as claimed in claim 14 wherein said first and second bidirectional impedance elements comprise first and second resistors, respectively.

16. The write amplifier as claimed in claim 15 wherein the first and second current drivers comprise first and second npn transistors coupled between a second point of second constant voltage and the first and second output terminals, respectively.

17. The write amplifier as claimed in claim 16 further comprising first and second series circuits each comprising an impedance element and a switchable current source coupled between said points of first and second constant voltage and each with an intermediate node coupled to respective control electrodes of the respective npn transistors of the first and second voltage drivers, respectively.

18. The write amplifier as claimed in claim 15 wherein at least the first voltage driver further comprises a pnp transistor connected in series circuit with the npn transistor between said point of first constant voltage and a point of second constant voltage, and a capacitor coupled to a circuit point between the pnp transistor and its series connected npn transistor and to the point of first constant voltage via a resistor.

19. The write amplifier as claimed in claim 14 further comprising first and second capacitors connected in parallel with said first and second bidirectional impedance elements, respectively.

20. The write amplifier as claimed in claim 19 further comprising third and fourth capacitors coupled in parallel with said first and second voltage drivers, respectively.

* * * * *

Disclaimer

6,324,028 B1 — Joao N. V. L. Ramalho, Bieville-Beuville (FR); Johannes O. Voorman, Eindhoven (NL); Gerben W. De Jong, Eindhoven (NL); Luan Le, Caen (FR); Eric Pieaerts, Caen (FR). RECORDING APPARATUS PROVIDED WITH A WRITE DRIVER CIRCUIT. Patent dated November 27, 2001. Disclaimer filed March 28, 2008, by the assignee, U.S. Philips Corporation.

Hereby enters this disclaimer to all claims of said patent.
*(Official Gazette, April 7, 2009)*